(12) United States Patent
Lee et al.

(10) Patent No.: US 7,998,783 B2
(45) Date of Patent: Aug. 16, 2011

(54) MANUFACTURING METHOD FOR ORGANIC LIGHT EMITTING DEVICE

(75) Inventors: Jaeyoon Lee, Seoul (KR); Choongkeun Yoo, Paju-si (KR); Aekyung Jeon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/884,639

(22) Filed: Sep. 17, 2010

(65) Prior Publication Data

US 2011/0070672 A1    Mar. 24, 2011

(30) Foreign Application Priority Data

Sep. 21, 2009    (KR) .......... 10-2009-0089260

(51) Int. Cl.
*H01L 21/00*    (2006.01)
(52) U.S. Cl. .......... 438/82; 438/99; 257/E33.001; 257/E25.008; 257/E51.018; 428/690; 428/917; 313/504; 313/506

(58) Field of Classification Search .......... 438/82, 438/99; 257/E33.001, E25.008, E51.018; 428/690, 917; 313/504, 506
See application file for complete search history.

(56) References Cited

U.S. PATENT DOCUMENTS

| 7,147,298 B2 * | 12/2006 | Usuda .......... 347/35 |
| 7,414,361 B2 * | 8/2008 | Nozawa .......... 313/506 |

* cited by examiner

*Primary Examiner* — Hsien Ming Lee
(74) *Attorney, Agent, or Firm* — McKenna Long & Aldridge LLP

(57) ABSTRACT

A method for manufacturing an organic light emitting device is disclosed. In one embodiment, the method includes an organic light emitting diode comprising a first electrode, a light emission layer, and a second electrode on a substrate; forming a first protection film by loading the substrate on which the organic light emitting diode has been formed to an inkjet device in a first direction; and forming a second protection film by loading the substrate on which the first protection film has been formed in a second direction, the first and the second direction being formed differently from each other.

8 Claims, 3 Drawing Sheets

(a)  (b)  (c)

MANUFACTURING METHOD FOR ORGANIC LIGHT EMITTING DEVICE

This application claims the benefit of Korean Patent Application No. 10-2009-0089260 filed on Sep. 21, which is hereby incorporated by reference for all purposes as if fully set forth herein.

BACKGROUND

1. Field of the Invention

This invention relates to an organic light emitting device. More specifically, this invention relates to a method for manufacturing an organic light emitting device by using an inkjet method.

2. Discussion of the Related Art

Recently, a flat panel display (FPD) is gaining more importance as the advancement of multimedia technology. To meet the demand for flat panel displays, various types of flat displays are being commercialized such as a liquid crystal display (LCD), a plasma display panel (PDP), a field emission display (FED), and an organic light emitting device.

In particular, an organic light emitting device provides a fast response time, which is 1 ms or less, with low power consumption and self-luminosity. In addition, since visual performance is secured independently of a viewing angle, the organic light emitting device is well-suited as a video display medium regardless of the device size. Also, since the organic light emitting device can be manufactured at low temperature and an employed manufacturing process is simple making use of conventional semiconductor process technologies, much attention is now paid to the organic light emitting device as a next generation flat display device.

Conventionally, an organic light emitting device has been manufactured by forming an organic light emitting diode comprising a first electrode, an organic film layer, and a second electrode on a substrate; and encapsulating with an adhesive the substrate and a sealing substrate made of glass or metal.

A thin organic light emitting device, however, is not easily obtained in a conventional method because the sealing substrate is used.

SUMMARY

An aspect of this invention is to provide a method for manufacturing an organic light emitting device with excellent display performance and a thin profile by sealing the organic light emitting device with a protection film by using an inkjet method.

A method for manufacturing an organic light emitting device according to one implementation of this invention comprises forming an organic light emitting diode comprising a first electrode, a light emission layer, and a second electrode on a substrate; forming a first protection film by loading the substrate on which the organic light emitting diode has been formed to an inkjet device in a first direction; and forming a second protection film by loading the substrate on which the first protection film has been formed in a second direction, the first and the second direction being formed differently from each other.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF ILLUSTRATED EMBODIMENTS

Reference will now be made in detail to embodiments of the invention, examples of which are illustrated in the accompanying drawings.

A method for manufacturing an organic light emitting device according to one implementation of this invention comprises forming an organic light emitting diode comprising a first electrode, a light emission layer, and a second electrode on a substrate; forming a first protection film by loading the substrate on which the organic light emitting diode has been formed to an inkjet device in a first direction; and forming a second protection film by loading the substrate on which the first protection film has been formed in a second direction, the first and the second direction being formed differently from each other.

The first protection film can be an organic film and the second protection film can be an inorganic film.

The organic film can be one or more selected from a group consisting of acryl, epoxy, siloxane, urethane, and polycarbonate.

The inorganic film can be one or more selected from a group consisting of metal, metal oxide, metal nitric oxide, silicon oxide, silicon nitride, and silicon nitric oxide.

An angle between the second direction and the first direction may be greater than 0 degrees and less than 180 degrees.

A method for manufacturing an organic light emitting device according to one implementation of this invention comprises forming an organic light emitting diode comprising a first electrode, a light emission layer, and a second electrode on a substrate; forming a first protection film by loading the substrate on which the organic light emitting diode has been formed to an inkjet device at a first position; and forming a second protection film by loading the substrate on which the first protection film has been formed at a second position.

The first position and the second position can be different from each other.

The second position can be a horizontal shift from the first position left or right.

The first protection film can be an organic film and the second protection film can be an inorganic film.

Hereinafter, implementations of this invention will be described in detail with reference to appended drawings.

Figure 1:
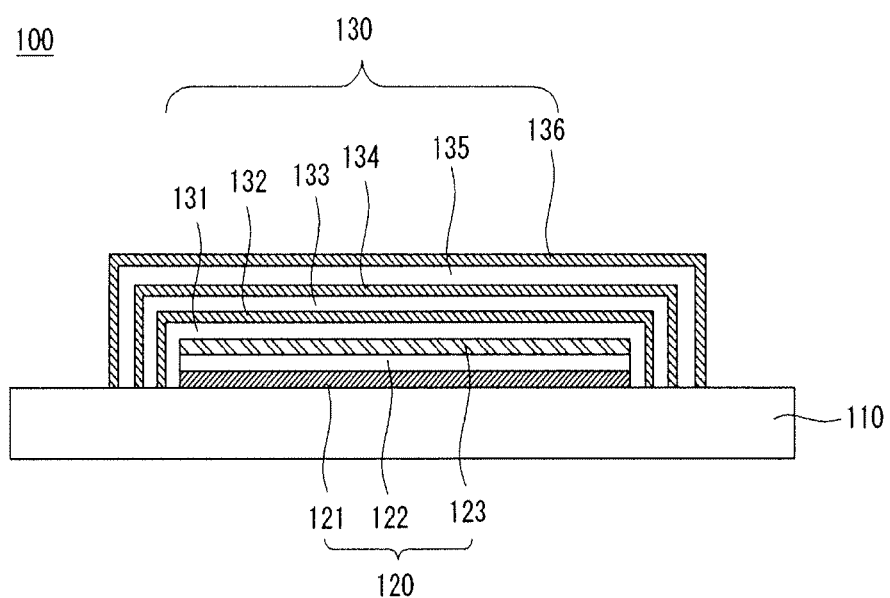
FIG. 1 illustrates an organic light emitting device of this invention.

FIG. 1 illustrates an organic light emitting device of this invention.

With reference to FIG. 1, an organic light emitting device 100 of this invention comprises a substrate 100; a first electrode 121 stacked sequentially on the substrate 110; an organic light emitting diode 120 comprising a light emission layer 122 and a second electrode 123; and a protection film 130 covering the organic light emitting diode 120.

The substrate 110 can use a transparent substrate made of glass, plastic, or conductive material. On the substrate 110, a buffer layer made of silicon oxide ($SiO_2$) or silicon nitric oxide (SiNx) can be further included to protect an organic light emitting diode formed in a succeeding process from impurities such as alkali ion flown out from the substrate 110.

On the substrate 110, an organic light emitting diode 120 comprising a first electrode 121, a light emission layer 122, and a second electrode 123 can be disposed.

The first electrode 121 can be anode, being either a transparent electrode or a reflective electrode. If the first electrode 121 is a transparent electrode, the first electrode 121 can be any one of ITO (Indium Tin Oxide), IZO (indium Zinc Oxide), or ZnO (Zinc Oxide). If the first electrode 121 is a reflective electrode, the first electrode can further comprise a reflective layer made of any one of aluminum (Al), silver (Ag), or nickel (Ni) under a layer made of any one of ITO, IZO, or ZnO. In addition, the reflective layer can be disposed between two layers made of any one of ITO, IZO, or ZnO.

The first electrode 121 can be formed by using sputtering, evaporation, vapor phase deposition, or electron beam deposition method.

A light emission layer 122 is disposed on the first electrode 121. A light emission layer 122 can further comprise at least one of a hole injection layer and a hole transporting layer between the first electrode 121 and the light emission layer 122 and can further comprise at least one of an electron transporting layer and an electron injection layer between the second electrode 123 and the light emission layer 122.

The hole injection layer facilitates injection of holes into the light emission layer 122 from the first electrode 121 and can be made of one or more selected from a group consisting of CuPc(copper phthalocyanine), PEDOT(poly(3,4)-ethylenedioxythiophene), PANI(polyaniline), and NPD(N,N-dinaphthyl-N,N'-diphenyl benzidine), which is not limited to the above.

The hole injection layer can be formed by using evaporation or spin coating method; thickness of the hole injection layer can range from 5 nm to 150 nm.

The hole transporting layer facilitates transportation of holes and can be made of one or more selected from a group consisting of NPD(N,N-dinaphthyl-N,N'-diphenyl benzidine), TPD(N,N'-bis-(3-methylphenyl)-N,N-bis-(phenyl)-benzidine), s-TAD, and MTDATA(4,4',4"-Tris(N-3-methylphenyl-N-phenyl-amino)-triphenylamine), which is not limited to the above.

The hole transporting layer can be formed by using evaporation or spin coating method; thickness of the hole transporting layer can range from 5 nm to 150 nm.

The light emission layer 122 can be made of material emitting red, green, and blue light; and can be formed by using phosphorescent or fluorescent material.

If the light emission layer 122 is red, the light emission layer 122 can comprise host material comprising CBP(carbazole biphenyl) or mCP(1,3-bis(carbazol-9-yl)) and can be made of phosphorescent material comprising dopant, the dopant comprising one or more selected from a group consisting of PIQIr(acac)(bis(1-phenylisoquinoline)acetylacetonate iridium), PQIr(acac) (bis(1-phenylquinoline)acetylacetonate iridium), PQIr(tris(1-phenylquinoline)iridium), and PtOEP(octaethylporphyrin platinum). Differently from the above, the light emission layer 122 can be made of fluorescent material comprising PBD:Eu(DBM)3(Phen) or Perylene, but is not limited to the above.

If the light emission layer 122 is green, the light emission layer 122 can comprise host material comprising CBP or mCP and can be made of phosphorescent material comprising dopant, the dopant comprising Ir(ppy)3(fac tris(2-phenylpyridine)iridium). Differently from the above, the light emission layer 122 can be made of fluorescent material comprising Alq3(tris(8-hydroxyquinolino)aluminum), but is not limited to the above.

If the light emission layer 122 is blue, the light emission layer 122 can comprise host material comprising CBP or mCP and can be made of phosphorescent material comprising dopant, the dopant comprising (4,6-F2ppy)2Irpic. Differently from the above, the light emission layer 122 can be made of fluorescent material comprising any one selected from a group consisting of spiro-DPVBi, spiro-6P, distilbenzene(DSB), distyrylarylene(DSA), PFO polymer, and PPV polymer, but is not limited to the above.

The electron transporting layer facilitates transportation of electrons and can be made of one or more selected from a group of Alq3(tris(8-hydroxyquinolino)aluminum), PBD, TAZ, spiro-PBD, BAlq, and SAlq, which is not limited to the above.

The electron transporting layer can be formed by using evaporation or spin coating method; thickness of the electron transporting layer can range from 1 nm to 50 nm.

The electron transporting layer can prevent holes injected from the first electrode 121 from passing through the light emission layer 122 to the second electrode 123. In other words, the electron transporting layer performs the role of a hole blocking layer, facilitating efficient combination between holes and electrons in the light emission layer.

The electron injection layer facilitates injection of electrons and can use Alq3(tris(8-hydroxyquinolino)aluminum), PBD, TAZ, spiro-PBD, BAlq, or SAlq, but is not limited to the above.

The electron injection layer can further comprise inorganic substance and the inorganic substance can further comprise metallic compound. The metallic compound can comprise alkali metal or alkali earth metal. Metallic compound comprising the alkali metal or alkali earth metal can be one or more selected from a group consisting of LiQ, LiF, NaF, KF, RbF, CsF, FrF, $BeF_2$, $MgF_2$, $CaF_2$, $SrF_2$, $BaF_2$, and $RaF_2$, but is not limited to the above.

The electron injection layer can be formed by evaporation or spin coating method or vacuum deposition of organic and inorganic substance. Also, thickness of the electron injection layer can range 1 nm to 50 nm.

The second electrode 123 can be cathode and can be made of magnesium (Mg), calcium (Ca), aluminum (Al), or silver (Ag) with a low work function, or an alloy of the above metal. At this point, the second electrode 123, if an organic light emitting device has a front emitting or a double-sided light emitting structure, can be formed with a thickness as thinly as light can penetrate; if the organic light emitting device is a backward emitting structure, the second electrode 123 can be formed as thickly as light can be reflected.

A protection film 130 covering the organic light emitting diode 120 can be disposed. The protection film 130 can prevent external moisture or air from penetrating into the organic light emitting diode 120 and protect the organic light emitting diode 120 from external impact.

The protection film 130 can comprise a first protection film 131, a second protection film 132, a third protection film 133, a fourth protection film 134, a fifth protection film 135, and a sixth protection film 136.

At least one of the first to the sixth protection film 131, 132, 133, 134, 135, 136 can be made of an organic film; for example, one or more selected from a group consisting of acryl, epoxy, siloxane, urethane, and polycarbonate can be used. At this point, if at least one of the first to the sixth protection film 131, 132, 133, 134, 135, 136 is an organic film, thickness of the corresponding film can range from 10 μm to 100 μm.

Also, at least one of the first to the sixth film 131, 132, 133, 134, 135, 136 can be made of an inorganic film; for example, one or more selected from a group consisting of metal, metal oxide, metal nitric oxide, silicon oxide, silicon nitride, and silicon nitric oxide can be used. At this point, metal can correspond to Al, Ag, Cu, or Au; metal oxide to $Al_2O_3$ or CuO. If at least one of the first to the sixth protection film 131, 132, 133, 134, 135, 136 is an inorganic film, thickness of the corresponding film can range from 0.01 μm to 5 μm.

The protection film 130 above can be formed as an organic film and an inorganic film are stacked alternately. For example, the first protection film 131 is made of an organic film; the second protection film 132 an inorganic film 132; again, the third protection film 133 an organic film; the fourth protection film 134 an inorganic film; again, the fifth protection film 135 an organic film; and the sixth protection film 136 an inorganic film. However, various other implementations can also be possible in addition to the above.

Thickness of the protection film 130 described above can range from 20 μm to 300 μm. If thickness of the protection film 130 is 20 μm or more, an advantageous effect can be achieved that the corresponding protection film can protect an organic light emitting diode 120 from external impact, moisture, and air; on the other hand, if thickness of the protection film 130 is 300 μm or less, an advantageous effect can be achieved that an organic light emitting device of a thin profile can be implemented by using the corresponding protection film.

In what follows, a method for manufacturing an organic light emitting device having the structure of this invention described above will be described.

Figure 2:
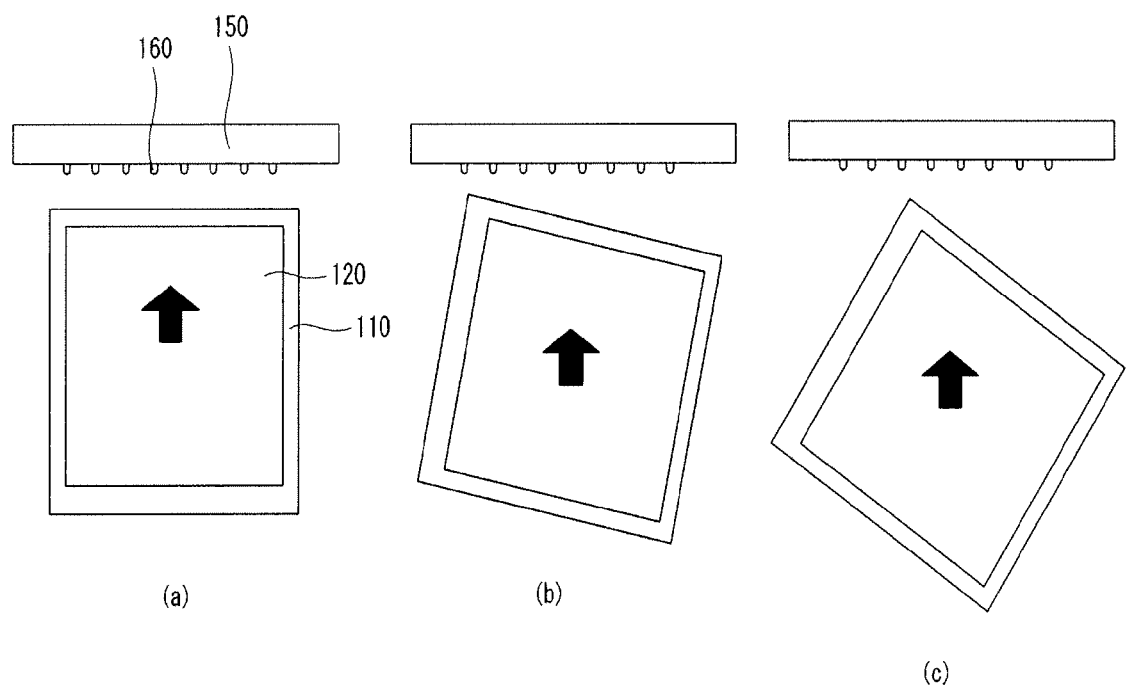
FIGS. 2 and 3 illustrate the respective processes of a method for manufacturing an organic light emitting device according to a first implementation of this invention.
Figure 3:
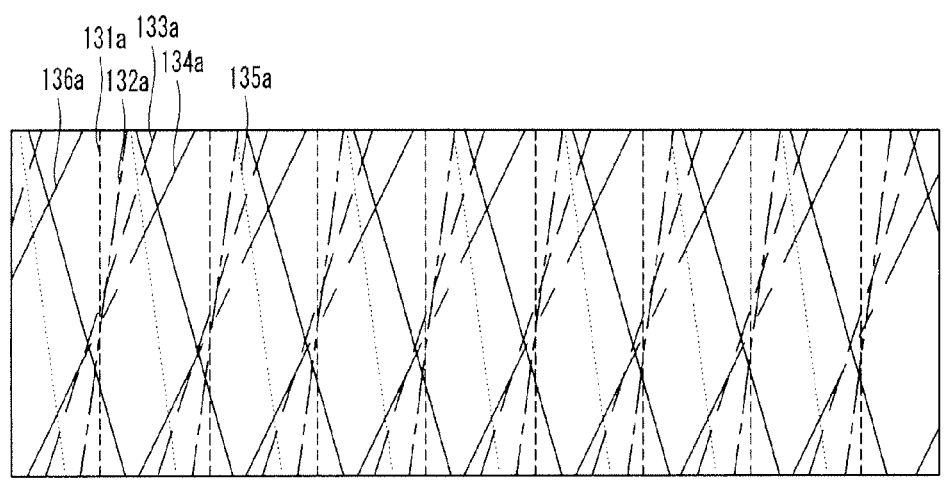

FIGS. 2 and 3 illustrate the respective processes of a method for manufacturing an organic light emitting device according to a first implementation of this invention. In the following, the same drawing symbols appeared in FIG. 1 will be used.

With reference to FIG. 1, a first electrode 121 is formed by depositing any one of ITO (Indium Tin Oxide), IZO (Indium Zinc Oxide) or ZnO (Zinc Oxide) on a transparent substrate 110 made of glass, plastic, or conductive material.

A light emission layer 122 is formed by depositing material emitting red, green, or blue light on the first electrode 121. Also, a hole injection layer, a hole transporting layer, an electron transporting layer, or an electron injection layer can be further formed in a upper or a lower part of the light emission layer 122.

Next, an organic light emitting diode 120 is formed by forming a second electrode 123 through depositing magnesium (Mg), calcium (Ca), aluminum (Al), silver (Ag), or an alloy of the four metals above on the substrate 110 comprising the light emission layer 122.

Next, with reference to FIG. 2, the substrate 110 on which the manufactured organic light emitting diode 120 has been formed is loaded into an inkjet device 150 in which a plurality of nozzles 160 have been formed. At this time, organic or inorganic ink is prepared for the inkjet device 150.

Organic ink can be any one selected from a group consisting of acryl, epoxy, siloxane, urethane, and polycarbonate.

Inorganic ink can be one or more selected from a group consisting of metal, metal oxide, metal nitric oxide, silicon oxide, silicon nitride, and silicon nitric oxide. At this time, if metal is considered, for example, inorganic ink can correspond to ink comprising metal particles, binder, and solvent.

As shown in FIG. 2A, the substrate 110 is loaded into the inkjet device 150 in a first direction and a first protection film 131 is formed by coating the substrate 110 with organic or inorganic ink.

With reference to FIG. 3 illustrating the substrate 110 on which the first protection film 131 has been formed, since the amount of ink discharged from a plurality of nozzles has a minute deviation due to inherent characteristics of an inkjet method once the first protection film 131 is formed, stains 131a can appear on the first protection film 131.

Next, as shown in FIG. 2B, after changing the loading direction toward a second direction by turning the substrate 110 a little, a second protection film 132 is formed on the first protection film 131. Accordingly, as shown in FIG. 3, stains 132a of the second protection film 132 formed in a different direction from the stains 131a of the first protection film 131 can appear.

At this time, an angle between the first and the second direction along which the substrate 110 is loaded may be greater than 0 degrees and less than 180 degrees. If the angle between the first and the second direction is greater than 0 degrees and less than 180 degrees, the stains 131a of the first protection film 131 and the stains 132a of the second protection film 132 are overlapped and can be visible to the human eye; thus, degradation of display performance can be prevented.

Next, as shown in FIG. 2C, after changing the loading direction of the substrate 110 by turning the substrate 110 still more, a third protection film 133 is formed on the second protection film 132. Likewise, after changing the loading direction of the substrate 110 by varying turning angles of the substrate 110, a fourth protection film 134, a fifth protection film 135, and a sixth protection film 136 are formed sequentially.

In this case, as shown in FIG. 3, stains 133a of the third protection film 133, stains 134a of the fourth protection film 134, stains 135a of the fifth protection film 135, and stains 136a of the sixth protection film 136 can appear. Since protection films are formed by changing the loading direction of the substrate 110, however, stains are not overlapped in a line shape. Therefore, stains of the respective protection films are dispersed and prevented from being observed when an image is displayed afterwards.

As described above, an organic light emitting device according to the first implementation of this invention is manufactured. An organic light emitting device according to the first implementation of this invention, by forming protection films by varying loading direction of the substrate, can prevent degradation of display performance due to overlap of the stains of the respective protection films.

Figure 4:
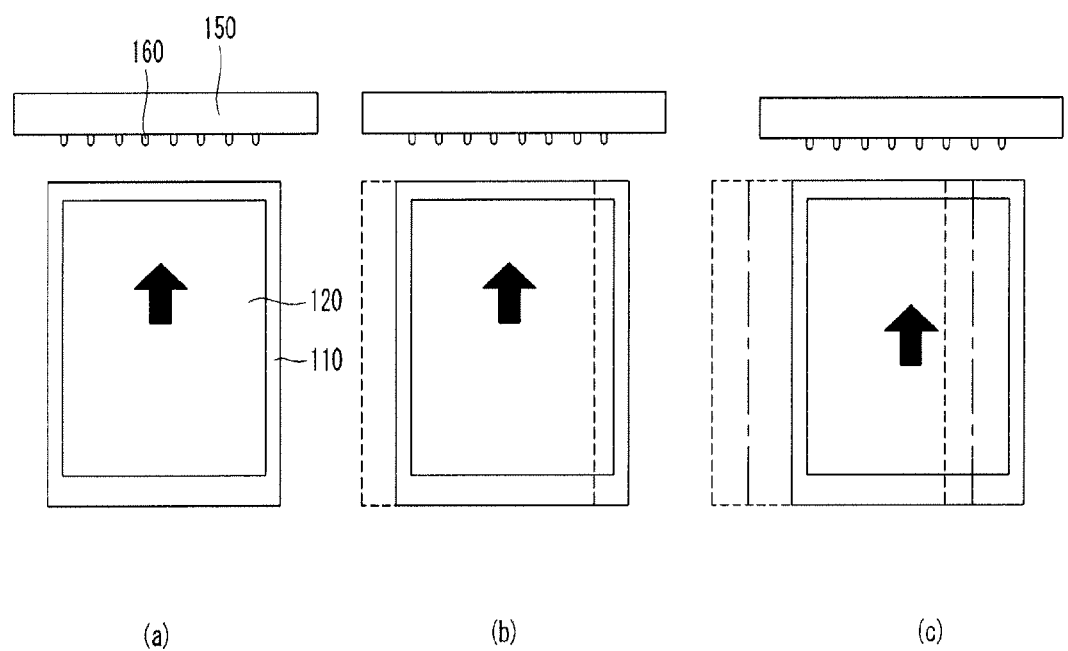
FIGS. 4 and 5 illustrate a method for manufacturing an organic light emitting device according to a second implementation of this invention.
Figure 5:
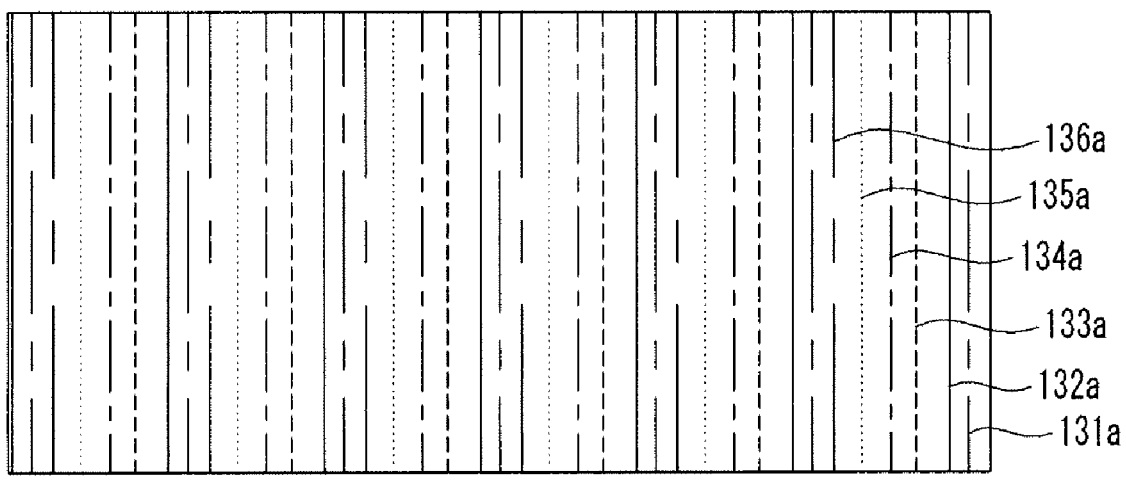

FIGS. 4 and 5 illustrate a method for manufacturing an organic light emitting device according to a second implementation of this invention.

With reference to FIG. 1 described above, a method for manufacturing an organic light emitting device according to a second implementation of this invention can manufacture an organic light emitting device by changing only the position of a substrate loaded into an inkjet device.

In other words, as shown in FIG. 4A, a first protection film 131 is formed by loading a substrate 110 in which an organic light emitting diode 120 has been formed into an inkjet device 150 from a first position.

With reference to FIG. 5 illustrating the substrate 110 on which the first protection film 131 has been formed, since the amount of ink discharged from a plurality of nozzles has a minute deviation due to inherent characteristics of an inkjet method once the first protection film 131 is formed, stains 131*a* can appear on the first protection film 131.

As shown in FIG. 4B, a second protection film 132 is formed on the first protection film 131 by moving the substrate 110 to a second position. Then, as shown in FIG. 5, stains 132*a* of the second protection film 132 can appear being shifted as much as the movement from the first position to the second position.

At this time, the first and the second position of the substrate 110 are different from each other and can be horizontally shifted left or right.

Next, as shown in FIG. 4C, a third protection film 133, a fourth protection film 134, a fifth protection film 135, and a sixth protection film 136 are formed sequentially on the second protection film 132 by shifting gradually the position of the substrate 110 sideways.

At this point, as shown in FIG. 5, stains 133*a* of the third protection film 133, stains 134*a* of the fourth protection film 134, stains 135*a* of the fifth protection film 135, and stains 136*a* of the sixth protection film 136 can appear. Since protection films are formed by changing the loading position of the substrate 110, however, stains are not overlapped in a line shape. Therefore, stains of the respective protection films are dispersed and prevented from being observed when an image is displayed afterwards.

According to the above, an organic light emitting device according to the second implementation of this invention is manufactured. An organic light emitting device according to the second implementation of this invention, by forming protection films by varying loading position of the substrate, can prevent degradation of display performance due to overlap of the stains of the respective protection films.

As described above, an organic light emitting device and a method for manufacturing the same according to implementations of this invention has an advantage that display performance is improved since stains of plurality of protection films are formed in such a way not to overlap with each other.

Also, another advantage is that since an organic light emitting device is sealed with a plurality of thin films instead of using a glass substrate, a display device of a thin profile can be realized.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method for manufacturing an organic light emitting device, comprising:
    forming an organic light emitting diode comprising a first electrode, a light emission layer, and a second electrode on a substrate;
    forming a first protection film by loading the substrate to an inkjet device;
    forming a second protection film by loading the substrate to the inkjet device; and rotating the substrate by an angle with respect to the inkjet device during forming the first and second protection layers.

2. The method of claim 1, wherein the first protection film is an organic film and the second protection film is an inorganic film.

3. The method of claim 2, wherein the organic film is one or more selected from a group consisting of acryl, epoxy, siloxane, urethane, and polycarbonate.

4. The method of claim 2, wherein the inorganic film is one or more selected from a group consisting of metal, metal oxide, metal nitric oxide, silicon oxide, silicon nitride, and silicon nitric oxide.

5. The method of claim 1, wherein the predetermined angle is greater than 0 degrees and less than 180 degrees.

6. A method for manufacturing an organic light emitting device, comprising:
    forming an organic light emitting diode comprising a first electrode, a light emission layer, and a second electrode on a substrate;
    forming a first protection film by loading the substrate to an inkjet device;
    forming a second protection film by loading the substrate to the inkjet device; shifting the substrate as a distance with respect to the inkjet device during forming the first and second protection layers.

7. The method of claim 6, wherein shifting the substrate is a horizontal shift left or right.

8. The method of claim 6, wherein the first protection film is an organic film and the second protection film is an inorganic film.

* * * * *